United States Patent [19]
Varian et al.

[11] Patent Number: 6,001,740
[45] Date of Patent: Dec. 14, 1999

[54] PLANARIZATION OF A NON-CONFORMAL DEVICE LAYER IN SEMICONDUCTOR FABRICATION

[75] Inventors: Kathryn H. Varian, Hopewell Junction; Dirk Tobben, Fishkill; Matthew Sendelbach, Wappingers Falls, all of N.Y.

[73] Assignees: Siemens Aktiengesellschaft, Munich, Germany; International Business Machines Corporation, Armonk, N.Y.

[21] Appl. No.: 09/187,165

[22] Filed: Nov. 6, 1998

Related U.S. Application Data

[62] Division of application No. 08/940,650, Sep. 30, 1997, Pat. No. 5,880,007.

[51] Int. Cl.[6] ..................................................... H01L 21/00
[52] U.S. Cl. ......................... 438/692; 216/38; 438/719; 438/756
[58] Field of Search ................... 216/38, 88, 89; 438/400, 424, 427, 430, 437, 444, 691, 692, 693, 719, 747, 748, 753, 756

[56] References Cited

U.S. PATENT DOCUMENTS

| | | | |
|---|---|---|---|
| 5,362,669 | 11/1994 | Boyd et al. | 438/692 X |
| 5,494,857 | 2/1996 | Cooperman et al. | 438/692 X |
| 5,674,783 | 10/1997 | Jang et al. | 438/692 X |

*Primary Examiner*—William Powell
*Attorney, Agent, or Firm*—Stanton C. Braden

[57] ABSTRACT

A substantially planar surface is produced from a non-conformal device layer formed over a complex topography, which includes narrow features with narrow gaps and wide features and wide gaps. A conformal layer is deposited over the non-conformal layer. The surface is then polished to expose the non-conformal layer over the wide features. An etch selective to the non-conformal layer is then used to substantially remove the non-conformal layer over the wide features. The conformal layer is then removed, exposing the non-conformal layer. The thickness of the non-conformal layer is now more uniform as compared to before. This enables the polish to produce a planar surface with reduced dishing in the wide spaces.

19 Claims, 3 Drawing Sheets

6,001,740

PLANARIZATION OF A NON-CONFORMAL DEVICE LAYER IN SEMICONDUCTOR FABRICATION

This is a divisional of application Ser. No. 08/940,650 filed Sep. 30, 1997, now U.S. Pat. No. 5,880,007.

FIELD OF THE INVENTION

The field of the present invention relates generally to semiconductor fabrication and, more particularly, to achieving a planar surface using a non-conformal film deposition.

BACKGROUND OF THE INVENTION

In device fabrication, insulating, semiconducting, and conducting layers are formed on a substrate. The layers are patterned to create features and spaces. The minimum dimension or feature size (F) of the features and spaces depends on the resolution capability of the lithographic systems. The features and spaces are patterned so as to form devices, such as transistors, capacitors, and resistors. These devices are then interconnected to achieve a desired electrical function, creating an integrated circuit (IC).

In advanced IC designs, different devices have different requirements to produce device features of different sizes. As a result, the device layer has features and spaces of varying sizes, creating a complex topography. A dielectric material, such as oxide, is used to fill the spaces between the features. Such material is typically deposited by various known chemical vapor deposition techniques. The deposited oxide material forms a conformal layer over the underlying device layer. As such, the deposited oxide material comprises a topography that reflects the topography of the underlying layer, reproducing the non-planar surface. The non-planar surface is then planarized by, for example, chemical mechanical polish to produce a planar surface. A planar surface is desired as it allows the formation of additional device layers to create additional device structures thereover, thus increasing device density.

As the size of features decreases in advanced IC designs, the spaces between the features become smaller which results in features with a high aspect ratio. Small high aspect ratio features make it difficult to fill the spaces with conventional CVD techniques. To facilitate gap fill of smaller spaces, high density plasma (HDP) CVD of oxide has been used.

HDP-CVD oxide creates a non-conformal layer. The non-conformal layer has a non-planar surface that does not reflect the topography of the underlying layer. The thickness of the non-conformal layer is greater above wide device features and thinner above the narrower device features. Such a topography creates difficulties for conventional planarization schemes to produce a planar surface. In particular, excessive erosion of the narrower, device features occurs because there exists a greater amount of deposited material over the wider device features than the narrower device features. Such excessive erosion adversely impacts the operation or functionality of the narrower devices, thereby decreasing yield.

The above discussion makes evident that it is desirable to achieve a planar surface after deposition of a non-conformal layer without excessive erosion of some device features.

SUMMARY OF THE INVENTION

The invention relates to the fabrication of integrated circuits. In particular, the invention provides a method for producing a planar surface over a non-conformal layer deposited over a complex topography which comprises narrow features with narrow gaps and wide features and wide gaps. The method includes depositing a non-conformal device layer over the surface of the substrate to fill the narrow and wide spaces, with the non-conformal device layer having a thickness over the wide features that is greater than the thickness over the narrow features. A conformal layer is deposited over the non-conformal layer, wherein the topography of the underlying non-conformal layer is reflected in the surface of the conformal layer. The surface of the substrate is then planarized using the non-conformal layer to serve as a stop layer. The planarization produces a planar surface between the conformal layer and the non-conformal layer, wherein the non-conformal layer over the wide features is exposed. The surface is etched selective to the conformal layer to substantially remove the non-conformal layer over the wide features except for small portions at the edges of the wide features protected by the conformal layer. An etch is then used to remove the conformal layer, with the etching leaving the non-conformal layer remaining over the surface of the narrow features and small portions at the edge of the wide features. A polish such as CMP produces a planar surface with the surface of the wide and narrow features. The polish produces a substantially planar surface with reduced dishing in the wide spaces as a result of substantially removing the non-conformal layer over the wide features.

BRIEF DESCRIPTION OF THE DRAWINGS

In order to better understand the present invention, reference should be made to the following detailed description and corresponding drawings, wherein.

DETAILED DESCRIPTION OF THE INVENTION

The present invention provides a planar surface after formation of a non-conformal layer without excessive erosion of some device features. To facilitate understanding of the invention, it is described in the context of forming shallow trench isolation (STI) to isolate devices of an IC. However, the invention is significantly broader and is applicable to reduce excessive erosion of some portion of the polish process.

Figure 1A:
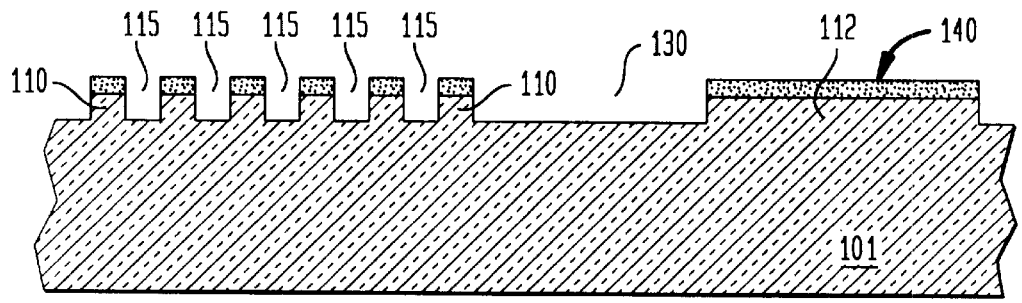
FIGS. 1a–1g show an illustrate embodiment of the invention for providing a planar surface on a non-conformal film.

FIGS. 1a–1g show a process for providing a planar surface in accordance with one embodiment of the invention. Referring to FIG. 1a, a cross-section of a portion of an IC is shown. Such IC includes a random access memory (RAM), a dynamic random access memory (DRAM), a synchronous DRAM (SDRAM), and a read only memory (ROM). Other ICs that are formed include an application specific integrated circuit (ASIC) or any logic circuit. Typically, a plurality of ICs are formed on the wafer in parallel. After processing is finished, the wafer is diced to separate the ICs into individual chips. The chips are then packaged, resulting in a final product that is used in, for example, consumer products such as computer systems, cellular phones, personal digital assistants (PDAs), and other electronic products. However, the invention is described in the context of forming an IC for ease of understanding. Further, the IC can be in any stage of processing.

A substrate 101 is provided for the formation of the IC. The substrate, for example, comprises a silicon wafer. Other semiconductor substrates such as gallium arsenide, germanium, silicon on insulator (SOI), or other semiconductor materials are also useful. The substrate, for example, may be lightly or heavily doped with dopants of a predetermined conductivity to achieve the desired electrical characteristics.

As shown, device features, such as mesas 110 and 112 separated by spaces 115 and 130, are formed on the surface of the substrate. Although as shown, the device features are formed in, for example, the silicon substrate, the substrate itself may comprise device layers stacked one upon another. For purposes of discussion, such device layers are generally referred to herein as a substrate.

In an illustrative embodiment, the spaces represent shallow trenches for forming STIs. The STIs separate active device regions, depicted by the mesas, on which devices are formed. In an integrated circuit, the device components generally vary in size. Consequently, the size of the active regions also vary. As depicted, active regions 110 are of the narrow variety, and active region 112 is of the wider variety. Also, due to the variety in size of the active areas, the shallow trenches may be of the relatively narrow variety 115 or of the wider variety 130. The actual sizes of the active areas and the shallow trenches are not critical. As it is desirable to fabricate integrated circuit structures with high component density, the narrow variety typically corresponds to about the minimum feature size (F) or groundrule while the wider variety corresponds to about greater than the minimum feature size. The surface geometry of the substrate 101 thus contains active areas 110 and 112 of near constant height. The width of the active areas, like the trenches that separate them, are of varying widths.

A stop layer 140 is provided on the top of the mesas. The stop layer, for example, is the hard mask layer used to pattern the features. The stop layer also serves as a polish or etch stop for subsequent processes. The stop layer comprises a material which the material used to fill the STIs can be removed selective thereto. In one embodiment, the stop layer comprises nitride. Additionally, a thin oxide layer is provided between the silicon substrate and nitride layer to promote adhesion between the device layers.

Formation of the trenches and mesas is achieved using conventional lithographic and etching techniques. This includes depositing a layer of photoresist on the surface of the nitride layer that covers the substrate. An exposure source generating, for example, deep ultra-violet (DUV) radiation illuminates a mask containing the desired pattern. The illumination creates an image of the mask which is projected or printed on the substrate surface, selectively exposing the photoresist layer with DUV radiation. Depending on whether a positive or negative resist is used, either the exposed or unexposed portions of the resist layer are removed during development to selectively expose regions of the substrate below corresponding to the shallow trench regions. The exposed regions are then etched by, for example, reactive ion etching (RIE) to create the mesas 110 and 112 and spaces 115 and 130.

Figure 1B:
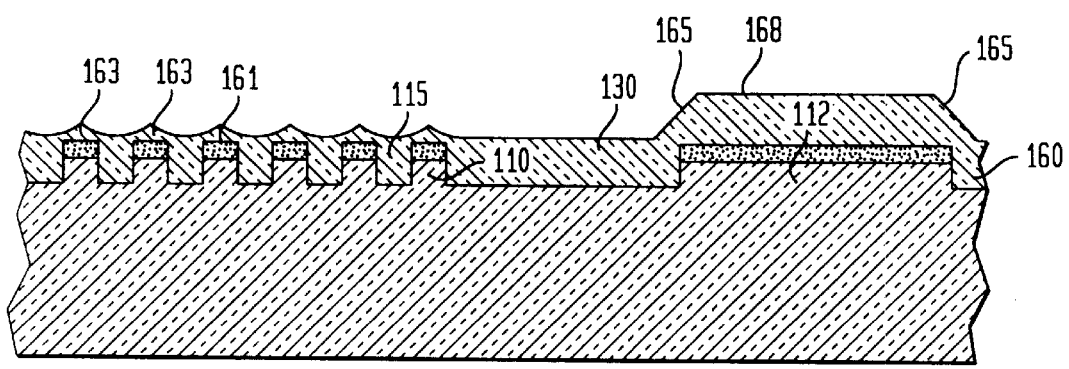

Referring to FIG. 1b, a non-conformal layer 160 is formed on the surface of the substrate. Due to the non-conformality of layer 160, it has a greater thickness over the surface of the wider active area 112 than that of the narrow active areas 110. Thus, the topography of the underlying layer is not reflected in the deposited layer 160.

In one embodiment, the non-conformal layer comprises oxide deposited by plasma-enhanced chemical vapor deposition (PECVD) using a high density plasma source (HDP-CVD). Such HDP-CVD techniques, for example, employ the use of an inductively coupled plasma source. HDP-CVD techniques are described in Francombe, *Physics of Thin Film*, Academic Press (1994), which is herein incorporated by reference for all purposes. The HDP-CVD deposited oxide sufficiently fills the trenches without voids. Other non-conformal layers that provide good gap fill without voids include those formed by electron cyclotron and helicon wave excited plasma techniques. Such techniques are also described in Francombe, *Physics of Thin Film*, Academic Press (1994), already herein incorporated by reference for all purposes.

As shown, the HDP-CVD oxide layer has a thickness sufficient to completely fill the shallow trenches. The filling of the shallow trenches also coats the surface of the substrate. As can be seen, the HDP-CVD technique provides a unique filling shape in the array. Above the active areas, the HDP-CVD oxide protrudes angularly from the shallow trenches, forming substantially sloping edges as the oxide layer coats the surface of the substrate. Illustratively, the sloping edges form small triangular structures 163 over the narrow active areas 110. The oxide layer 160 above the wide active area 112 comprises substantially complimentary sloping edges 165 and 166 with a planar central portion 168. The oxide layer in this region is thicker than the triangular structures 163. The unique triangular structures formed over the active regions are due to the in-situ sputtering that occurs during the HDP-CVD process.

Keep in mind however that the formation of triangles 163 is not critical and is shown for purposes of illustration. Whether the oxide layer forms triangles above the active areas, i.e., the merging of the two complementary sloping edge, depends on the width of the active areas and the thickness of the oxide layer. For example, some narrow active areas may not be narrow enough for the complementary edges to merge. As such, a shape of the oxide layer would be a triangular shape similar to that located above the wide active areas except with a narrower planar central portion.

Advantageously, the HDP-CVD oxide provides good gapfill and is of sufficient density to provide sufficient wet etch selectivity for subsequent process steps. As such, HDP-CVD oxides do not require an overfill of about 1½ times the step, as required by non-HDP-CVD oxides. By being able to deposit a lower amount of material, less have to be removed. This results in higher throughput.

Figure 1C:
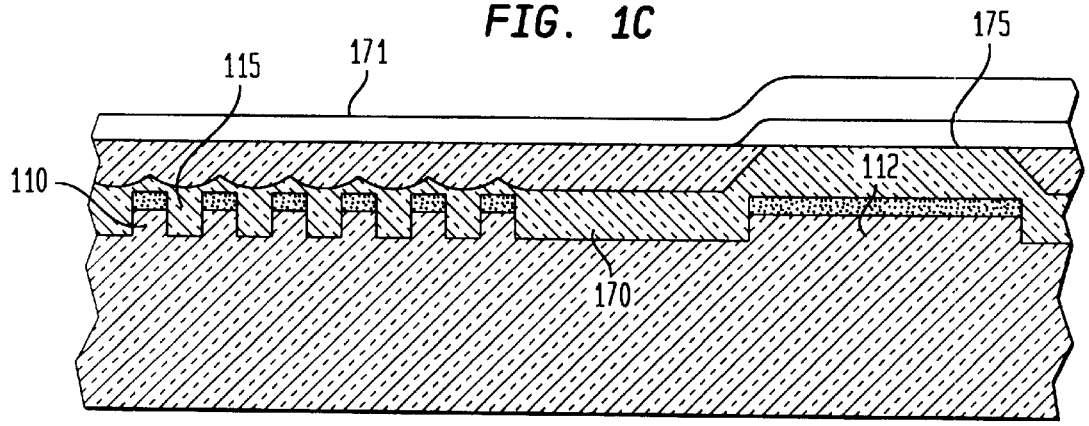

Referring to FIG. 1c, a sacrificial device layer 170 is formed over the layer 160. The sacrificial layer comprises a material that can be removed selective to the non-conformal layer 160. In one embodiment, the sacrificial layer comprises polysilicon (poly). The poly is deposited over the surface by, for example, CVD. As shown, the CVD produces a conformal poly layer over the non-conformal layer 160. The poly is sufficiently thick such that the top surface of the poly in the depressed regions 171 is above the top surface of the non-conformal layer in the highest region 175.

Figure 1D:
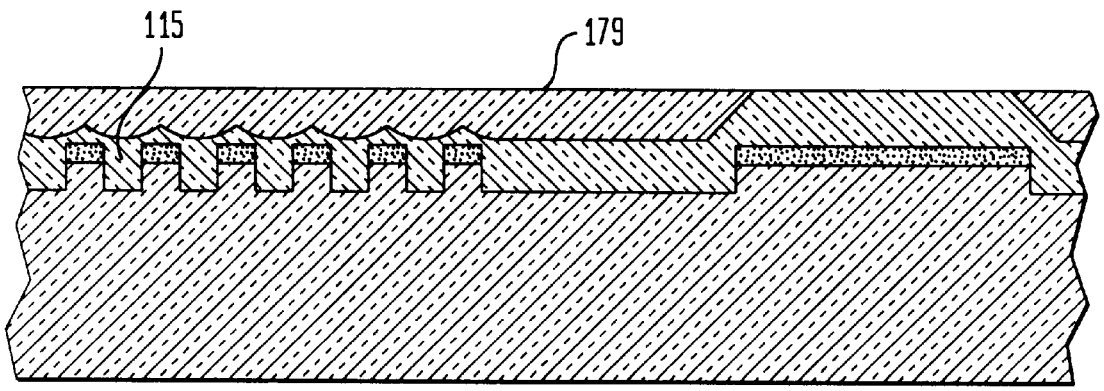

Referring to FIG. 1d, the poly layer is planarized by CMP selective to oxide. The CMP polish attacks the raised portion of the poly first, removing material therefrom. As more and more material from the raised region is removed, the surface of the poly becomes more planar. The CMP continues until the surface of the oxide layer 160 in the raised region is exposed, thus producing a planar top surface 179. As shown, the planar top surface includes poly and oxide regions.

Figure 1E:
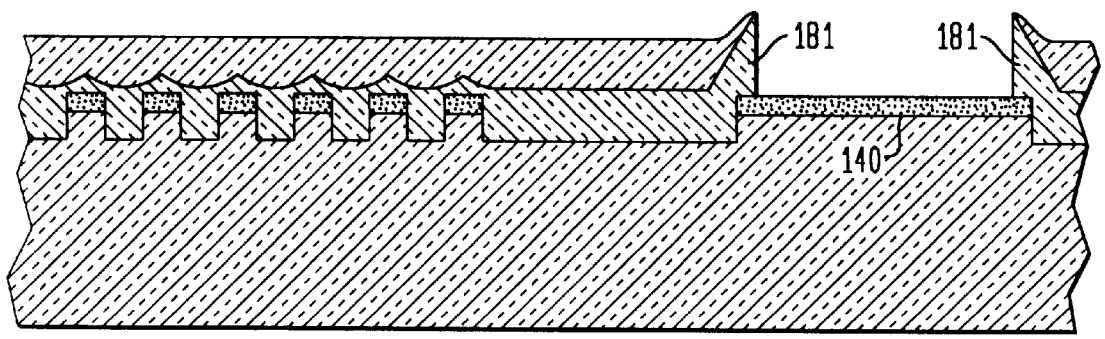

Referring to FIG. 1e, an anisotropic etch selective to poly and nitride is performed to remove the exposed oxide material. The etch, for example, is a reactive ion etch (RIE).

The nitride layer 140 on the surface of the mesa serves as an etch stop. As such, the oxide is removed, exposing the nitride layer. The portions 181 of the oxide protected by the poly remains due to the fact that the RIE is anisotropic.

Figure 1F:
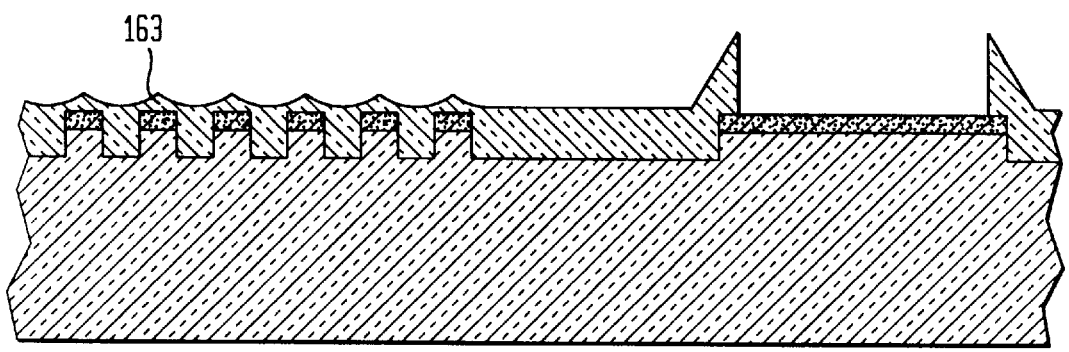
Figure 1G:
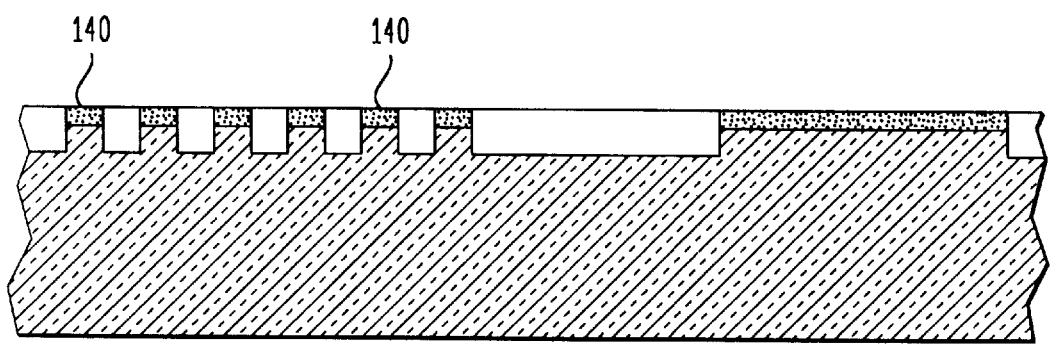

In FIG. 1f, the poly is removed by, for example, a dry etch after the RIE. This leaves the non-conformal layer exposed along with the nitride layer 140 over the wide active region 112. Also, the oxide fence 181 remains near the etch of the wide active region. As can be seen, the relative amount of oxide material that needs to the removed in the region over the narrow active area is about the same amount as that over the wide active region. Although the fences 181 are relatively higher than the triangles 163, the fences are easily removed by the CMP since they are quite thin. This enables the CMP to planarize the surface of the non-conformal layer 160 using the nitride 140 as a polish stop without excessive erosion of the narrow active areas 110, as shown in FIG. 1f.

After the planar surface is formed, the nitride layer is removed from the surface of the mesas. Removal of the nitride is achieved by, for example, a wet etch selective to silicon. This produces a planar surface with the top of the mesas with the oxide, thus completing the formation of the STIs.

After a highly planarized surface structure containing STI regions which permit device isolation is provided, the IC can then be further processed in accordance with known IC technology.

While the invention has been particularly shown and described with reference to various embodiments, it will be recognized by those skilled in the art that modifications and changes may be made to the present invention without departing from the scope thereof. Merely by way of example, the illustrative embodiments of the invention have been described with specific materials for the insulating and dielectric layers. Furthermore, the dimension of the openings can be varied for specific applications. The scope of the invention should therefore be determined not with reference to the above description but with reference to the appended claims along with their full scope of equivalents.

What is claimed:

1. In the fabrication of integrated circuits, a method for planarizing a non-conformal film comprising:
    providing a semiconductor substrate, wherein the surface of the substrate includes narrow features separated by narrow spaces and wide features separated by wide spaces;
    depositing a non-conformal device layer over the surface of the substrate to fill the narrow and wide spaces, the non-conformal device layer having a thickness over the wide features that is greater than the thickness over the narrow features;
    depositing a conformal layer over the non-conformal layer, wherein the topography of the underlying non-conformal layer is reflected in the surface of the conformal layer;
    planarizing the conformal layer, using the non-conformal layer to serve as a stop layer, the planarizing producing a planar surface between the conformal layer and the non-conformal layer, wherein the non-conformal layer over the wide features is exposed;
    etching the non-conformal layer selective to the conformal layer, the etching substantially removing the non-conformal layer over the wide features except for small portions at the edges of the wide features protected by the conformal layer;
    etching to remove the conformal layer, the etching leaving the non-conformal layer remaining over the surface of the narrow features and small portions at the edge of the wide features; and
    polishing to produce a planar surface with the surface of the wide and narrow features, wherein the polish results in a substantially planar surface with reduced dishing in the wide spaces as a result of substantially removing the non-conformal layer over the wide features.

2. The method of claim 1 wherein the semiconductor wafer is a silicon wafer.

3. The method of claim 1 wherein the step of planarizing comprises chemical mechanical polishing.

4. The method of claim 1 wherein the non-conformal layer is a deposited oxide layer.

5. The method of claim 4 wherein the conformal layer is a deposited silicon layer.

6. The method of claim 5 wherein the conformal layer is a deposited layer of polysilicon.

7. In the fabrication of integrated circuits, a method for producing a substantially planar surface by filling spaces between features, said method comprising:
    providing a substrate having a surface, said surface having features separated by spaces, said features including narrow features and wide features;
    depositing a non-conformal layer of a first material over the surface of the substrate to fill the spaces, the non-conformal layer having a thickness over the wide features that is greater then the thickness over the narrow features;
    depositing a second layer of a second material over the non-conformal layer;
    chemical mechanical polishing to remove portions of the second layer, while using the non-conformal layer as a stop layer, until the non-conformal layer over at least some of the wide features is exposed;
    etching the non-conformal layer selective to the second layer, the etching substantially removing the non-conformal layer over said at least some of the wide features;
    etching the second layer selective to the non-conformal layer until the non-conformal layer is exposed; and
    chemical mechanical polishing to remove the non-conformal layer from over the narrow features and from over the spaces while leaving the non-conformal layer in the spaces.

8. The method of claim 7 wherein the substrate is a semiconductor substrate.

9. The method of claim 7 wherein the semiconductor substrate is a silicon wafer.

10. The method of claim 7 wherein the first material is a deposited oxide.

11. The method of claim 7 wherein the first material is oxide deposited by plasma-enhanced chemical vapor deposition using a high density plasma source.

12. The method of claim 10 wherein the second material is silicon.

13. The method of claim 12 wherein the second material is polysilicon.

14. The method of claim 7 wherein the features are mesas and the spaces are trenches.

15. A method for filling trenches between active areas in a semiconductor substrate, said active areas including narrow active areas and wide active areas, said method comprising:

depositing a first layer of a first material, said first layer filling the trenches and covering the active areas, said first layer being thicker over the wide active areas than over the narrow active areas;

depositing a second layer of a second material over the first layer;

removing some of the second layer by using chemical mechanical polishing selective to the second material;

terminating the chemical mechanical polishing when the first layer over the wide active areas becomes exposed by the chemical mechanical polishing and while the remainder of the first layer remains covered by the remainder of the second layer;

removing the remainder of the second layer by using an etch selective to the second material; and removing the first layer from over the narrow active regions and from over the trenches, by chemical mechanical polishing, the first layer remaining in the trenches.

16. The method of claim 15 wherein the semiconductor substrate is a silicon wafer.

17. The method of claim 16 wherein the first material comprises oxide.

18. The method of claim 17 wherein the first material is oxide deposited by plasma-enhanced chemical vapor deposition using a high density plasma source.

19. The method of claim 15 wherein the second material is silicon.

* * * * *